(12) United States Patent
Kido (10) Patent No.: US 7,226,865 B2
(45) Date of Patent: Jun. 5, 2007

(54) PROCESS FOR FORMING PATTERN AND METHOD FOR PRODUCING LIQUID CRYSTAL DISPLAY APPARATUS

(75) Inventor: Shusaku Kido, Izumi (JP)

(73) Assignee: NEC LCD Technologies, Ltd. (JP)

( * ) Notice: Subject to any disclaimer, the term of this patent is extended or adjusted under 35 U.S.C. 154(b) by 0 days.

(21) Appl. No.: 11/268,811

(22) Filed: Nov. 7, 2005

(65) Prior Publication Data

US 2006/0060560 A1 Mar. 23, 2006

Related U.S. Application Data

(62) Division of application No. 10/077,226, filed on Feb. 15, 2002, now Pat. No. 7,033,951.

(30) Foreign Application Priority Data

Feb. 27, 2001 (JP) .............................. 2001-52308

(51) Int. Cl.
*H01L 21/302* (2006.01)
(52) U.S. Cl. ...................... 438/698; 438/660; 438/710; 438/720; 430/312

(58) Field of Classification Search ................ 438/660, 438/669, 698, 706, 710, 720, 717, 715, 708, 438/725; 430/312, 313
See application file for complete search history.

(56) References Cited

U.S. PATENT DOCUMENTS

| | | | | |
|---|---|---|---|---|
| 5,320,932 A | * | 6/1994 | Haraguchi et al. | 430/312 |
| 5,618,384 A | * | 4/1997 | Chan et al. | 438/597 |
| 5,670,801 A | * | 9/1997 | Nakano | 257/198 |
| 6,255,130 B1 | * | 7/2001 | Kim | 438/30 |
| 6,331,443 B1 | * | 12/2001 | Lee et al. | 438/30 |
| 6,762,802 B2 | * | 7/2004 | Ono et al. | 349/38 |

* cited by examiner

*Primary Examiner*—Lan Vinh
(74) *Attorney, Agent, or Firm*—Hayes Soloway P.C.

(57) ABSTRACT

A process for forming a pattern contains steps of: forming a first mask pattern on a film to be etched on a substrate; forming a first pattern of the film to be etched by using the first mask pattern as a mask; forming a second mask pattern having a plane shape different from that of the first mask pattern by deforming the first mask pattern; and forming a second pattern of the film to be etched different from the first pattern by using the second mask pattern. By applying the process for forming a pattern, for example, to the formation of a semiconductor layer and source and drain electrodes of a TFT substrate of a liquid crystal display apparatus, the above-stated formation requiring two photoresist process steps in a conventional manufacturing method of a liquid crystal display apparatus can be carried out by only one process step, thereby reducing manufacturing cost thereof.

6 Claims, 9 Drawing Sheets

(PRIOR ART)

PROCESS FOR FORMING PATTERN AND METHOD FOR PRODUCING LIQUID CRYSTAL DISPLAY APPARATUS

CROSS-REFERENCE TO RELATED APPLICATION

This Application is a divisional of U.S. application Ser. No. 10/077,226, filed Feb. 15, 2002 now U.S. Pat. No. 7,033,951.

BACKGROUND OF THE INVENTION

1. Field of the Invention

The present invention relates to a process for forming a pattern of a semiconductor device used in a liquid crystal display apparatus and a method for producing a liquid crystal display apparatus using the process for forming a pattern, and in particular, to a process for forming a complex pattern, such as wirings, in a simplified manner and a method for producing a liquid crystal display apparatus using the process for forming a pattern.

2. Description of the Prior Art

A process for producing a liquid crystal display apparatus uses a photolithography technique and a dry etching technique that are used for producing an integrated circuit. Therefore, as is seen in activities to reduce process steps for producing the integrated circuit, in the process for producing a liquid crystal display apparatus, efforts in reducing the number of the total process steps for forming patterns, such as wirings, are exercised as well to reduce the production cost thereof.

A method for reducing the process steps for forming patterns employed for forming wirings in the conventional technique will be described.

Figure 1A:
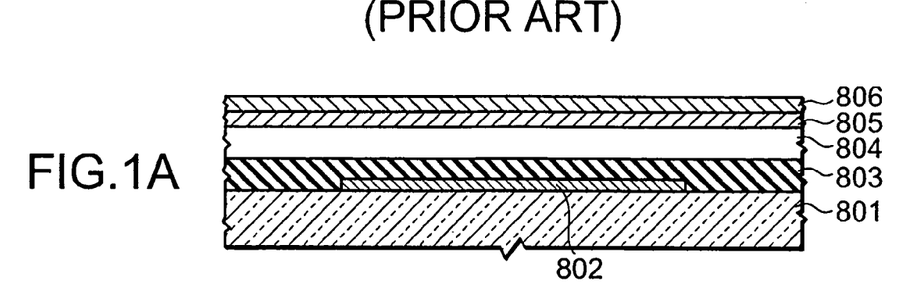
FIGS. 1A to 1D are cross sectional views showing the conventional process steps for forming a pattern.

In the conventional process for forming wirings, as shown in FIG. 1A, a gate electrode 802 is formed on a glass substrate 801 by the known photolithography technique and the known etching technique. Then, a gate insulating film 803, an amorphous silicon film 804, an n⁺ type amorphous silicon film 805 and a metal film 806 are successively deposited to form a laminated structure.

Figure 1B:
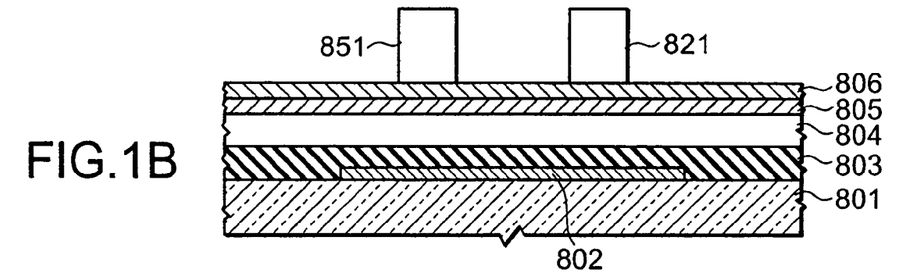
Figure 1C:
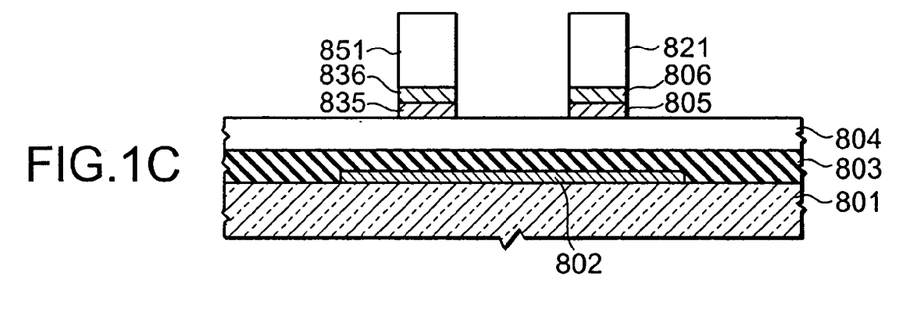

As shown in FIG. 1B, mask patterns 821 and 851 made of a photoresist are formed on the metal film 806 by the known photolithography technique, and the metal film 806 and the n⁺ type amorphous silicon film 805 are sequentially subjected to dry etching by using the mask patterns 821 and 851 as a mask. As a result, ohmic contact layers 805 and 835, a source electrode 806 and a drain electrode 836 are formed on the amorphous silicon film 804 as shown in FIG. 1C.

Figure 1D:
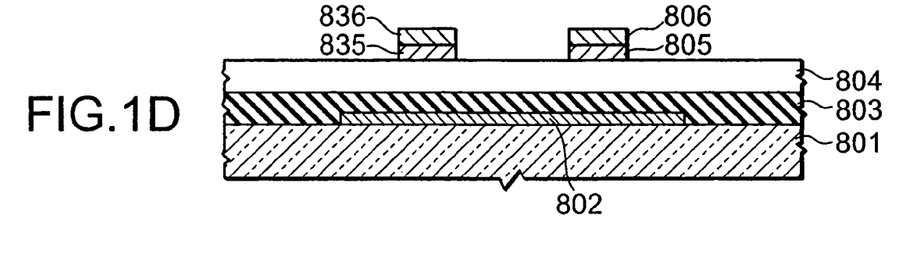
Figure 2A:
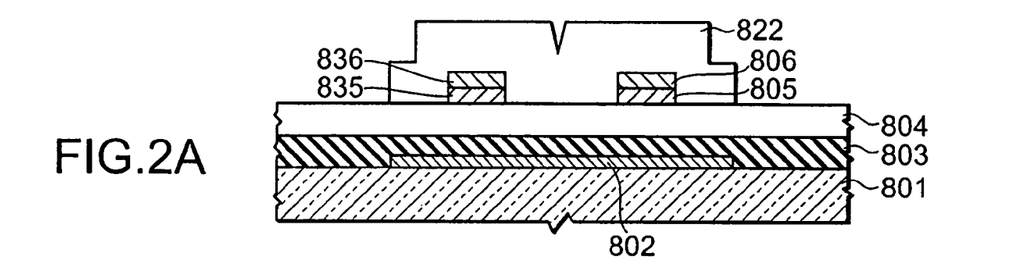
FIGS. 2A to 2C are cross sectional views showing process steps following the conventional process step of FIG. 1D.

Thereafter, the mask patterns 821 and 851 are removed as shown in FIG. 1D, and then a mask pattern 822 is formed to cover the ohmic contact layer 805, the source electrode 806, the ohmic contact layer 835, the drain electrode 836 and a part of the surface of the film 804 as shown in FIG. 2A.

Figure 2B:
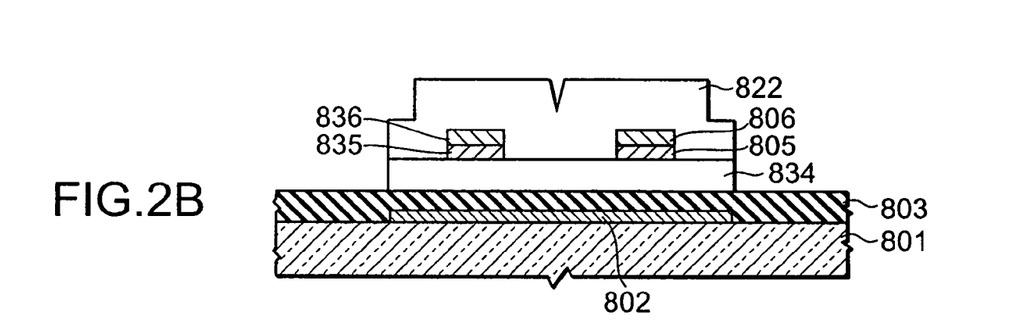

As shown in FIG. 2B, by using the mask pattern 822 as a mask, the underlying amorphous silicon film 804 is selectively removed by etching to form a semiconductor island 834, in which a channel is to be formed later on.

Figure 2C:
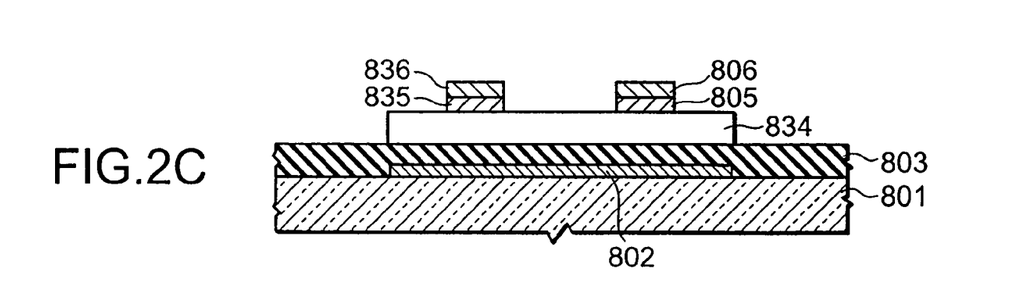

Thereafter, the mask pattern 822 is removed as shown in FIG. 2C, whereby such a state is obtained that an inversely staggered TFT is formed on the glass substrate 801. A pixel electrode and a passivation insulating film, for example, are then formed, so as to constitute an active matrix TFT substrate of a liquid crystal display apparatus.

However, in the conventional method for producing an active matrix TFT described above, the semiconductor layer, in which a channel is to be formed, needs to be formed in the form of an island on an insulating substrate made of a glass or the like to form a TFT. Therefore, it is concluded that the conventional method for producing an active matrix TFT needs an additional photolithography step in comparison to the production process of a general MOSFET, thereby increasing the production cost thereof.

SUMMARY OF THE INVENTION

The invention has been conceived to solve the problems associated with the conventional technique, and an object of the invention is to reduce the number of the process steps followed by reduction of the manufacturing cost.

In accordance with one aspect of the invention comprises a process for forming a pattern containing steps of: forming a first mask pattern on a film to be etched on a substrate; etching the film to be etched to form a first pattern therein by using the first mask pattern as a mask; forming a second mask pattern having a plane shape different from that of the first mask pattern by deforming the first mask pattern; and etching the film to be etched to form a second pattern therein different from the first pattern by using the second mask pattern as a mask.

In the process for forming a pattern in accordance with the one aspect of the invention, a process for forming the second mask pattern used in the step of forming the second pattern in the film to be etched does not need a photolithography technique therefor.

Also in the process in accordance with the one aspect of the invention, the amount of exposure to the photoresist is appropriately changed in accordance with regions of the photoresist to be exposed, whereby the regions having different film thicknesses, i.e., a thin film thickness and a thick film thickness, are formed in the first mask pattern. In this case, the following pretreatment process can be employed. That is, after forming the first pattern in the film to be etched and in addition, before deforming the first mask pattern, the first mask pattern made of the photoresist is etched to remove the region having a thin film thickness while leaving the region having a thick film thickness.

In accordance with another aspect of the invention, a process for producing a liquid crystal display apparatus contains the steps of:

forming a TFT substrate manufactured by the steps of:

forming a gate wiring and a gate electrode on a first substrate and further, forming a gate insulating film over the gate wiring and gate electrode on the first substrate, gate insulating film; forming a semiconductor film, a semiconductor and ohmic contact film (hereinafter, denoted by semiconductor/ohmic contact film), and a metal film for source and drain, in this order from the bottom, on the gate insulating film; forming resist masks for source and drain electrodes respectively on the metal film for source and drain above the gate electrode; etching and removing the metal film for source and drain and the semiconductor/ohmic contact film by using the resist masks for source and drain electrodes as masks, so as to form a laminated film pattern consisting of the semiconductor/ohmic contact film and the metal film for source and drain; connecting the resist masks for source and drain electrodes to form "a connected resist mask" by reflowing the resist masks for source and drain electrodes in a lateral direction, whereby the laminated film pattern is completely covered by the connected resist mask; and etching the semiconductor film to form a semiconductor island by using the connected resist mask as a mask;

disposing a second substrate facing the semiconductor island of the first substrate with respect thereto, so as to form an opposing substrate; and filling a gap between the TFT substrate and the opposing substrate with a liquid crystal composition, in which the step of connecting the resist masks for source and drain electrodes is carried out by thermal reflow of resist performed by heating the resist masks for source and drain electrodes.

DETAILED DESCRIPTION OF THE PREFERRED EMBODIMENTS

Embodiments in accordance with the invention will be described in detail with reference to accompanying drawings.

Embodiment 1

A first embodiment of the invention will be described. FIGS. 3A to 5C illustrates a process flow for producing a liquid crystal display device employing the process steps for forming a pattern in accordance with the embodiment. FIGS. 3A to 6A illustrate a process flow for forming a TFT on a glass substrate 101, which employs the process steps for forming a pattern in accordance with the present invention.

Figure 3A:
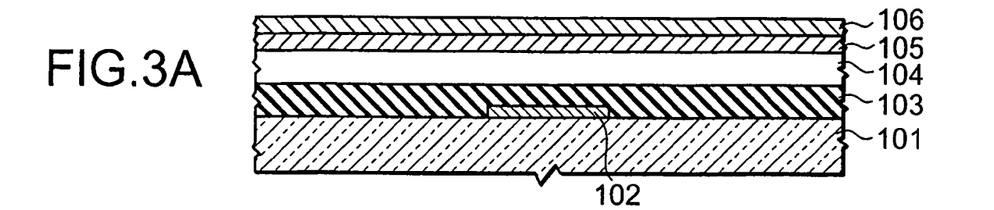
FIGS. 3A to 3C are cross sectional views showing process steps for forming a pattern in accordance with an embodiment of the invention.

As shown in FIG. 3A, a gate electrode 102 is formed on a glass substrate 101 by the known photolithography technique and the known etching technique. The gate electrode 102 may consists of, for example, a polysilicon having a high impurity concentration.

An insulating film such as a silicon oxide film is deposited to a thickness of about 350 nm on the glass substrate 101 while covering the gate electrode 102 to form a gate insulating film 103. Subsequently, a silicon film 104 made of an amorphous silicon having a thickness of about 200 nm, an $n^+$ type silicon film 105 made of an $n^+$ type amorphous silicon having a thickness of about 50 nm and a metal film 106 having a thickness of about 50 nm are sequentially deposited on the gate insulating film 103 to form a laminated film.

Figure 3B:
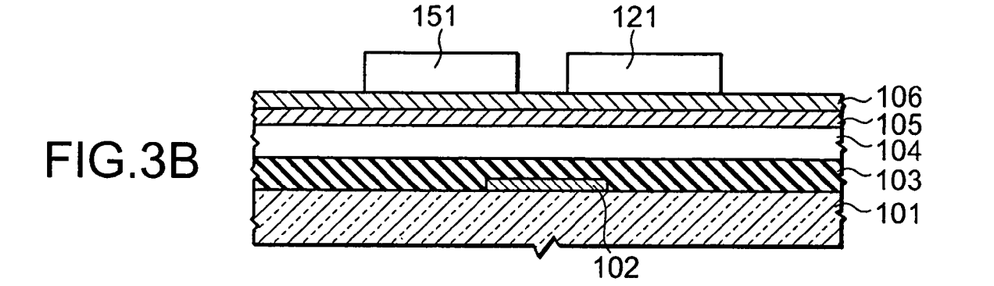

As shown in FIG. 3B, mask patterns 121 and 151 made of a photoresist are formed on the metal film 106 by the known photolithography technique. In this step, for example, a positive photoresist made of a novolak resin is coated on the metal film 106, and is heated (pre-baking) to a temperature of about from 80 to 100° C. to remove a solvent component included in the coated photoresist film. An optical image having a prescribed pattern is transformed into the pre-baked photoresist film by irradiating light (exposure) to form a latent image on the photoresist film.

The photoresist film having the latent image is developed with a developer solution, such as an alkali solution, to dissolve the exposed region of the photoresist film to leave only the unexposed region thereof. Thereafter, the development is terminated, for example, by washing with water, and then rinse and drying are carried out. As a result, the mask patterns 121 and 151 shown in FIG. 3B are formed. In the following description, a sequence of the process steps of coating the photoresist, development, washing with water and drying is referred to as a photolithography process.

Figure 3C:
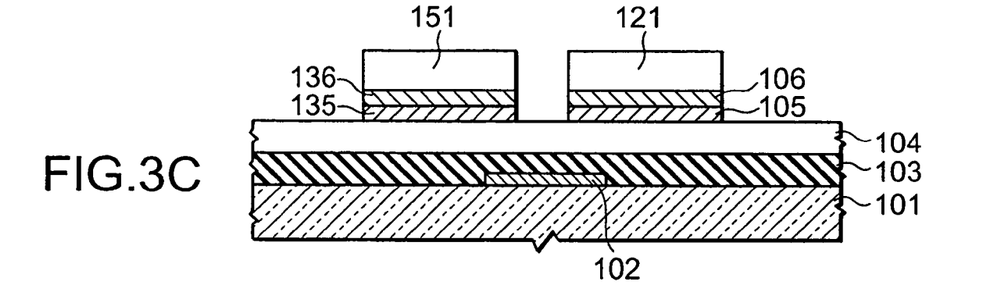
Figure 3D:
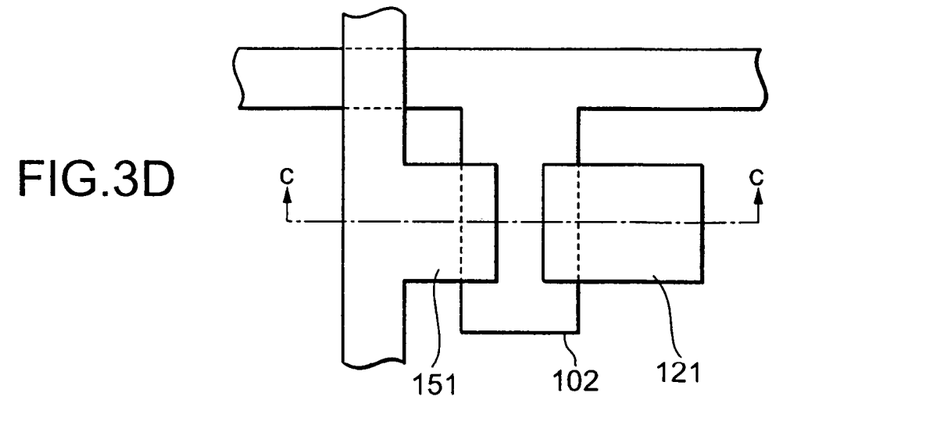
FIG. 3D is a plan view to be referred when referring to FIGS. 3A to 3C.

The metal film 106 and the $n^+$ type silicon film 105 are sequentially subjected to dry etching by using the mask patterns 121 and 151 formed by the lithography process as masks. As a result, as shown in FIG. 3C and the plan view of FIG. 3D, ohmic contact layers 105 and 135, a source electrode 106 and a drain electrode 136 are formed on the silicon film 104. Note that in the plan view of FIG. 3D, the glass substrate 101, the gate insulating film 103 and the silicon film 104 are omitted.

The mask patterns 121 and 151 are heated together with the glass substrate 101 to apply heat at a temperature of from 120 to 300° C. to the mask patterns 121 and 151 for from 5 to 60 minutes. The heat treatment can be carried out, for example, by placing the glass substrate 101 on a hot plate. Instead of heat treatment performed by a hot plate, it may be carried out by lamp annealing using an oven or an infrared ray. Furthermore, the heat treatment that the glass substrate 101 is immersed in water having a temperature of from 40 to 300° C. and a pressure of from 2 to 40 atoms to heat the mask patterns 121 and 151 may also be employed.

The mask patterns 121 and 151 made of an organic resin are heated and then, are gradually softened to reflow and expand over the surface of the silicon film 104. As a result of the deformation, the mask patterns 121 and 151 are in contact with each other on the silicon film 104 between the ohmic contact layers 105 and 135.

Figure 4A:
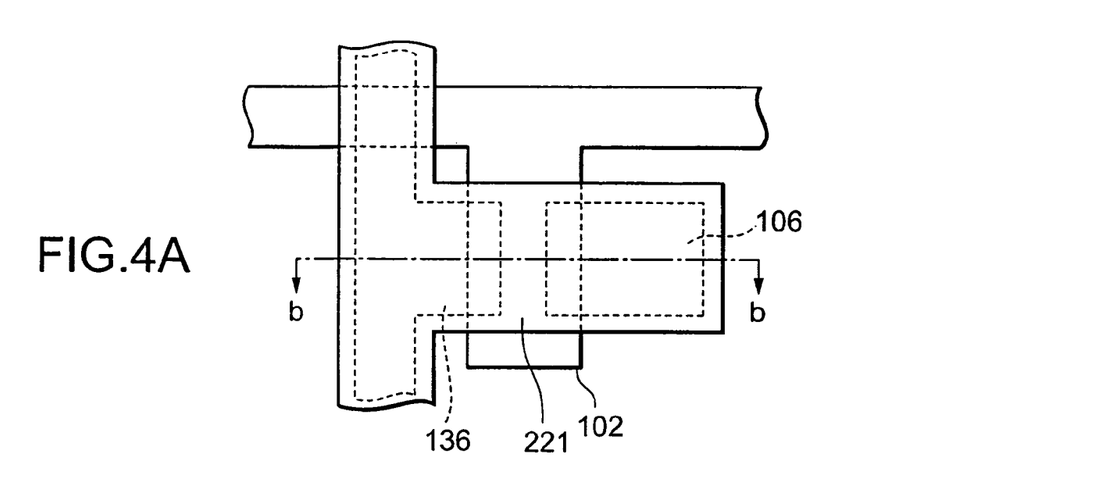
FIG. 4A is a plan view showing the process step for forming a pattern in accordance with the embodiment of the invention.
Figure 4B:
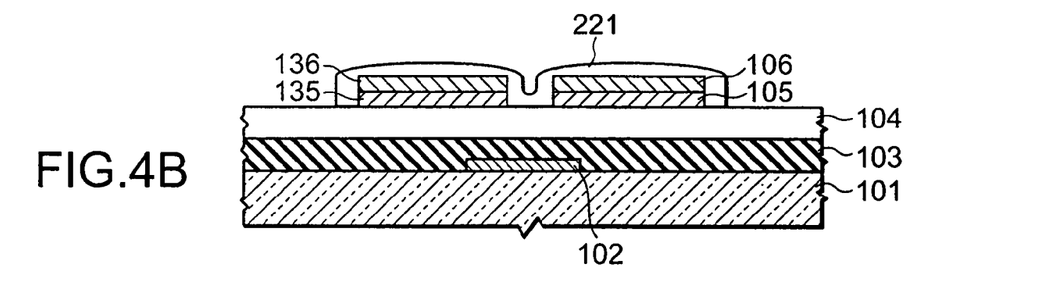
FIGS. 4B, 4C are cross sectional views showing process steps following the process step of FIG. 3C.

Consequently, as shown in the plan view of FIG. 4A and the cross sectional view of FIG. 4B, such a reflow mask pattern 221 is formed that covers the source electrode 106, the drain electrode 136 and the ohmic contact layers 105 and 135 while covering a part of the silicon film 104 interposed between the ohmic contact layers 105 and 135. Note that formation of the reflow mask pattern 221 can be accelerated by removing a deterioration layer at the surface of the mask pattern, which is formed through dry etching using the mask patterns 121 and 151 in FIGS. 3B and 3C.

The removal of the deterioration layer can be carried out by exposing the mask patterns in a plasma at an $O_2$ flow rate of 300 sccm, a pressure of 100 Pa and an RF power of 1,000 W for 120 seconds. Note that instead of $O_2$ gas for the plasma treatment, a fluorine series gas or a mixture of an $O_2$ gas and a fluorine series gas can be employed. In the case of a fluorine series gas, one of $SF_6$, $CF_4$ and $CHF_3$ may be used at a flow rate of 100 sccm for the case of a fluorine series gas, and in the case of a mixture of an $O_2$ gas and a fluorine series gas, one of $SF_6/O_2$, $CF_4/O_2$ and $CHF_3/O_2$ may be used at a flow rate of 50/300 sccm.

Furthermore, the removal of the deterioration layer may also be carried out in such a manner that the mask patterns are placed in an ozone gas atmosphere while being heated by heating the substrate to a temperature of about from 100 to 200° C., and then are irradiated with an ultraviolet ray to remove the deterioration layer. The removal of deterioration layer makes the difference in degree of reflow of the mask patterns, which is seen between the inner and outer portions of the mask patterns, reduced to cause uniform reflow thereof.

Figure 4C:
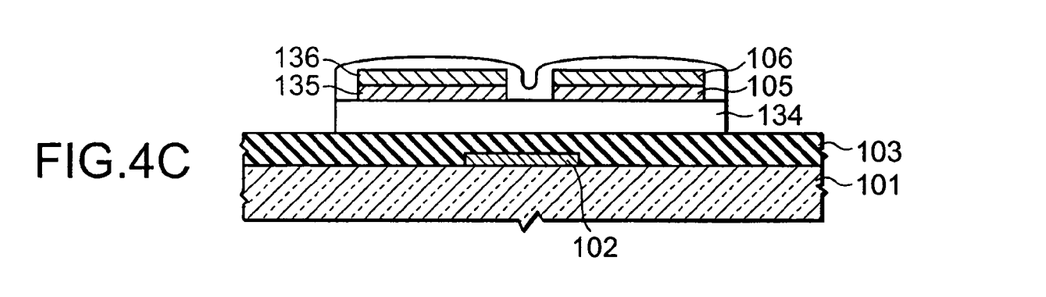

Subsequently, the silicon layer 104 is selectively etched and removed by using the reflow mask pattern 221 as a mask to form a semiconductor island 134 on the gate insulating film 103 as shown in FIG. 4C.

Figure 5A:
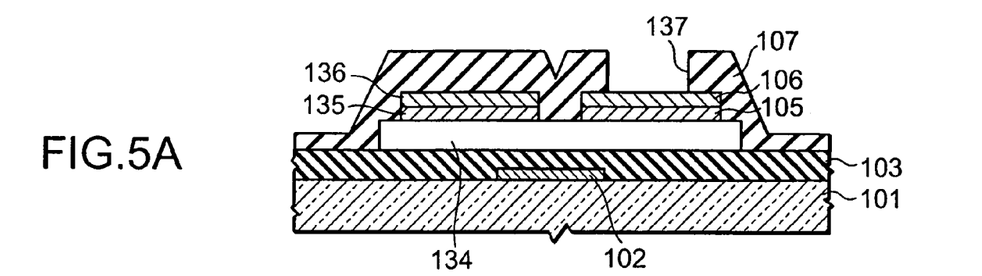
FIGS. 5A and 5C are cross sectional views showing process steps following the process step of FIG. 4C in accordance with the embodiment of the invention.
Figure 5B:
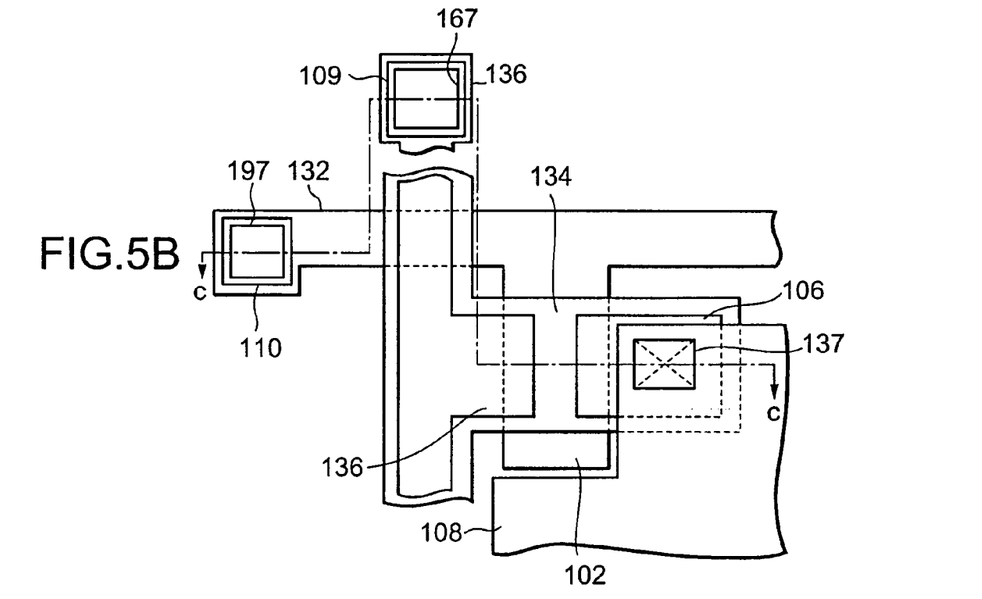
FIG. 5B is a plan view to be referred when referring to FIG. 5C.

Thereafter, as shown in FIG. 5A, a passivation film 107 is formed to cover the gate insulating film 103, the source electrode 106 and the drain electrode 136, and a contact hole 137 is formed therein. As shown in FIG. 5B, a contact hole 167 is formed in an extended part of the drain electrode 136. A contact hole 197 is also formed in an end part of the gate line 132 extending from the gate electrode 102.

The contact holes 137 and 167 can be formed by the well-known lithography technique and the etching technique. The etching can be carried out by applying $SF_6$+He gas as an etching gas at flow rate of 50/150 sccm, a pressure of 10 Pa and an output power of 1,000 W for 250 seconds.

Figure 5C:
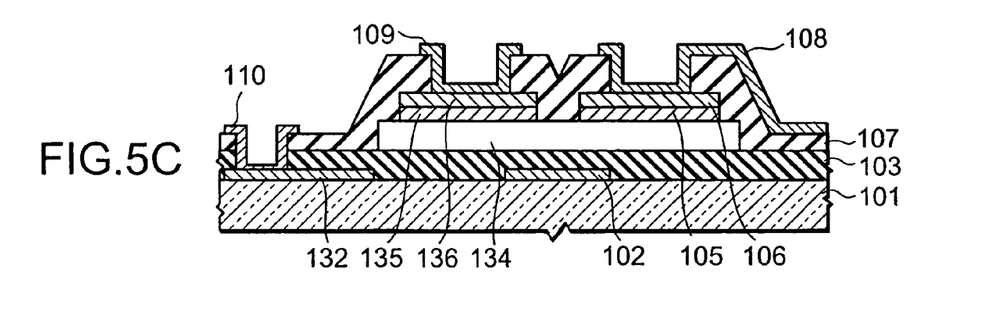

Subsequently, as shown in FIGS. 5B and 5C, a pixel electrode 108 connected to the source electrode 106 via the contact hole 137 and a terminal electrode 109 connected to an extended part of the drain electrode 136 via the contact hole 167 are formed. At the end part of the gate line 132, a terminal electrode 110 connected thereto is formed through the contact hole 197.

The source electrode 106, the drain electrode 136 and the pixel electrode 108 are made, for example, of an ITO, and can be formed in such a manner that after depositing a metal film on the passivation film 107, the metal film is etched to have prescribed patterns by the known photolithography technique and using an etching liquid of ferrous chloride series.

Though detailed descriptions of process steps following the above-described process steps are omitted, the following process steps as an exemplified step will be performed: An alignment layer is formed to complete a TFT substrate; then, a second insulating substrate facing the insulating substrate 21 is prepared, and a color filter, a black matrix, a transparent electrode, a passivation film and an alignment layer are formed thereon to complete an opposing substrate; and thereafter, the TFT substrate and the opposing substrate are attached to each other having a prescribed gap therebetween via a spacer; and finally, a liquid crystal composition is filled into the gap between TFT substrate and the opposing substrate to complete a liquid crystal display apparatus.

In all the embodiments described later on, the foregoing process steps for producing a liquid crystal display apparatus are carried out subsequent to the process steps described in the foregoing drawings.

It should be noted that FIG. 5B is a plan view and FIG. 5C is a cross sectional view taken along the line c—c in FIG. 5B. In FIG. 5B, the glass substrate 101, the gate insulating film 103, the ohmic contact layers 105, 135 and the passivation film 107 are omitted for convenience.

As described above, according to the embodiment, though the formation of the mask patterns 121, 151 shown in FIG. 3B is carried out by using the photolithography technique, the formation of the reflow mask pattern 221 shown in FIGS. 4A, 4B does not need such photolithography technique. As a result, the formation of a thin film transistor (TFT) array for a liquid crystal display apparatus can be carried out via a reduced number of process steps.

Though the mask patterns 121, 151 are formed by using a positive photoresist made of a novolak resin in the embodiment, formation of the mask patterns is not limited to the foregoing construction, and therefore, positive photoresists made of other resin series may be employed as a positive photoresist or a negative photoresist may also be employed instead of a positive photoresist. Furthermore, instead of a photoresist, other organic resins may be employed.

Additionally, the gate electrode, the source electrode and the drain electrode may employ one of the following constructions: a one-layer structure of aluminum or an alloy thereof; a one-layer structure of chromium or an alloy thereof; a two-layer structure of aluminum or an alloy thereof and chromium or an alloy thereof; a two-layer structure of aluminum or an alloy thereof and titanium or an alloy thereof; a two-layer structure of aluminum or an alloy thereof and titanium nitride or an alloy thereof; a two-layer structure of aluminum or an alloy thereof and molybdenum or an alloy thereof; a two-layer structure of chromium or an alloy thereof and molybdenum or an alloy thereof; a three-layer structure of chromium or an alloy thereof, aluminum or an alloy thereof and chromium or an alloy thereof; a three-layer structure of molybdenum or an alloy thereof, aluminum or an alloy thereof and molybdenum or an alloy thereof; a three-layer structure of aluminum or an alloy thereof, molybdenum or an alloy thereof and chromium or an alloy thereof; a three-layer structure of aluminum or an alloy thereof, molybdenum or an alloy thereof and titanium or an alloy thereof; and a three-layer structure of aluminum or an alloy thereof, titanium nitride or an alloy thereof and titanium or an alloy thereof.

Embodiment 2

Another embodiment of the invention will be described. FIGS. 6A to 7C are drawings showing the main process steps in accordance with the embodiment.

Also in this embodiment, process steps similar to that of the foregoing embodiment are performed. That is, as shown in FIG. 3A, a gate electrode 102 is formed on a glass substrate 101, a gate insulating film 103 is formed on the glass substrate 101 to cover the gate electrode 102, and a silicon film 104, an n$^+$ type silicon film 105 and a metal film 106 are sequentially deposited on the gate insulating film 103.

Figure 6A:
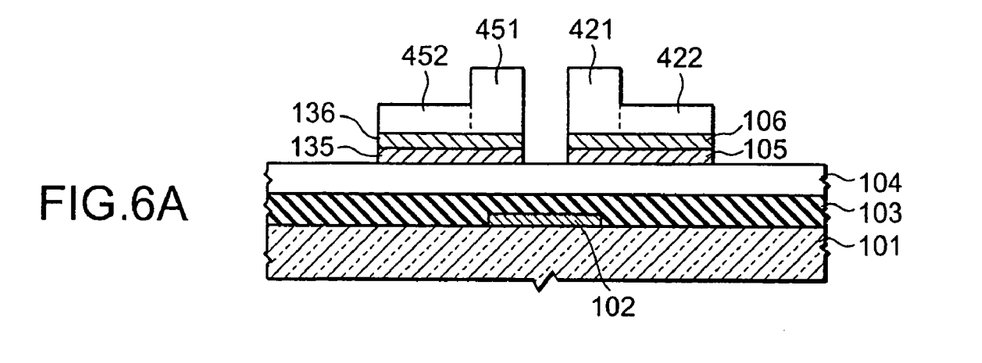
FIG. 6A is a cross sectional view showing the process step for forming a pattern in accordance with another embodiment of the invention.

Thereafter, as shown in FIG. 6A, thick mask patterns 421 and 451 made of a positive photoresist and thin mask patterns 422 and 452 correspondingly connected thereto are formed. The thick mask patterns 421, 451 are formed to have a thickness of about 3 µm, and the thin mask patterns 422, 452 are formed to have a thickness of about from 0.2 to 0.7 µm.

The above-described mask patterns 422, 452 can be formed in such a manner that after coating a photoresist film on the metal film 106, a region of the photoresist film where the thin mask patterns 422, 452 are to be formed is exposed through an image-patterned mask at an amount of light lower than that for the other region.

It should be noted that during the exposure, a region of the photoresist film where the thick mask patterns 421, 451 are to be formed is not exposed. For example, the above-described exposure status of photoresist film can be realized by using the following mask: within the photomask, a photomask pattern corresponding to the thin mask pattern allows a light to transmit to some extent; and another photomask pattern corresponding to the thick mask pattern shields a light.

Instead of the above-described photomask used to form the thin and thick mask patterns, the following operation for forming the thin and thick mask patterns using two-times exposure can be employed: the first exposure step is carried out so that a region of a photoresist film where the thick mask patterns 421, 451 are to be formed is not exposed and the other region is exposed at a reduced amount of light; and then, the second exposure step is carried out so that while the regions of the photoresist film corresponding to the mask patterns 421, 451, 422, 452 are kept not to be exposed, the other region is are again exposed.

After the above-described exposure step, the positive photoresist is developed and thus, the part of the positive photoresist corresponding to the thick mask patterns 421, 451 remains without being dissolved, the part thereof corresponding to the thin mask patterns 422, 452 is dissolved to some extent, and the part thereof corresponding to the region excluding the mask patterns 421, 451, 422, 452 is completely dissolved and removed. As a result, as shown in FIG. 6A, the thick mask patterns 421, 451 having a thick film thickness and the thin mask patterns 422, 452 having a thin film thickness can be simultaneously formed.

Figure 6B:
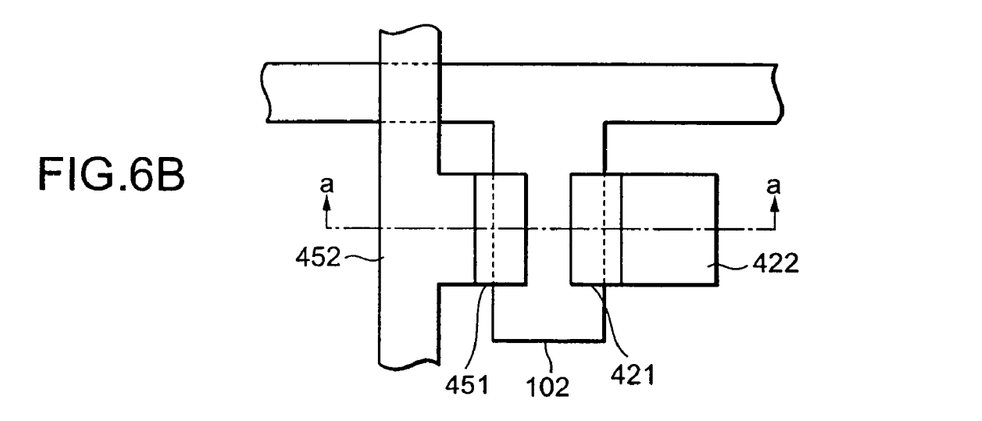
FIGS. 6B, 6C are plan views to be referred when referring to FIG. 6A.

After forming the thick mask patterns 421, 451 and the thin mask patterns 422, 452 as described above, dry etching is carried out by using those mask patterns as a mask and then, ohmic contact layers 105, 135, and source/drain electrodes 106, 136 are formed on the silicon film 104 as shown in FIGS. 6A, 6B. Note that in the plan view of FIG. 6B, the glass substrate 101, the gate insulating film 103 and the silicon film 104 are omitted, and the ohmic contact layers 105, 135 and the source/drain electrodes 106, 136 exist under the mask patterns which prevent operation for viewing the above-stated parts in the plan view.

Figure 6C:
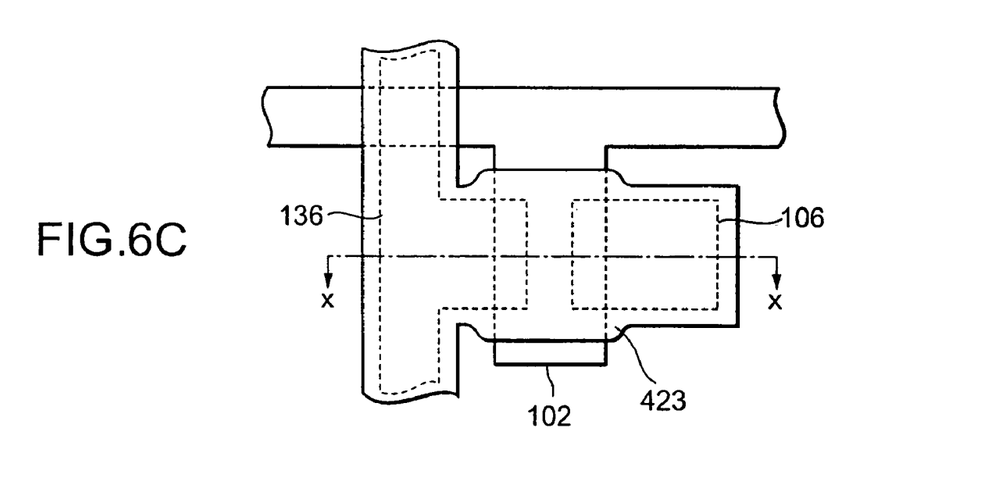

After forming the ohmic contact layers 105, 135, a reflow step similar to that of the foregoing embodiment is carried out by heating the thick mask patterns 421, 451 and the thin mask patterns 422, 452. As a result of the reflow step, the mask patterns made of an organic resin expand over the surface of the silicon film 104 to connect the thick mask patterns 421 and 451 together on the silicon film 104 between the ohmic contact layers 105, 135. As a whole, the thick mask pattern 421 and the thin mask pattern 422 are melted together, and the thick mask pattern 451 and the thin mask pattern 452 are also melted together while expanding in a lateral direction, whereby a reflow mask pattern 423 is formed as shown in FIG. 6C.

Figure 7A:
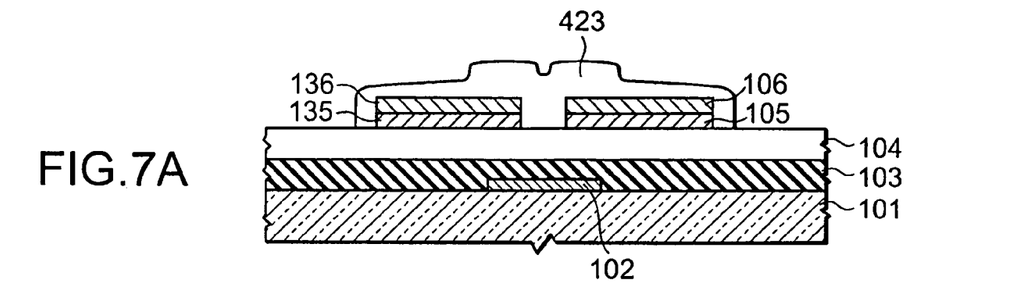
FIG. 7A is a cross sectional view showing the process step following the process step of FIG. 6A in accordance with the another embodiment of the invention.

Within the reflow mask pattern 423, a region corresponding to the thick mask patterns 421, 451 has area larger than that of the other region. Furthermore, the region corresponding to the thick mask patterns 421, 451 has a film thickness thicker than that of the other region as shown in FIG. 7A. Note that the cross sectional view of FIG. 7A is a view taken along the line x—x in FIG. 6C.

Figure 7B:
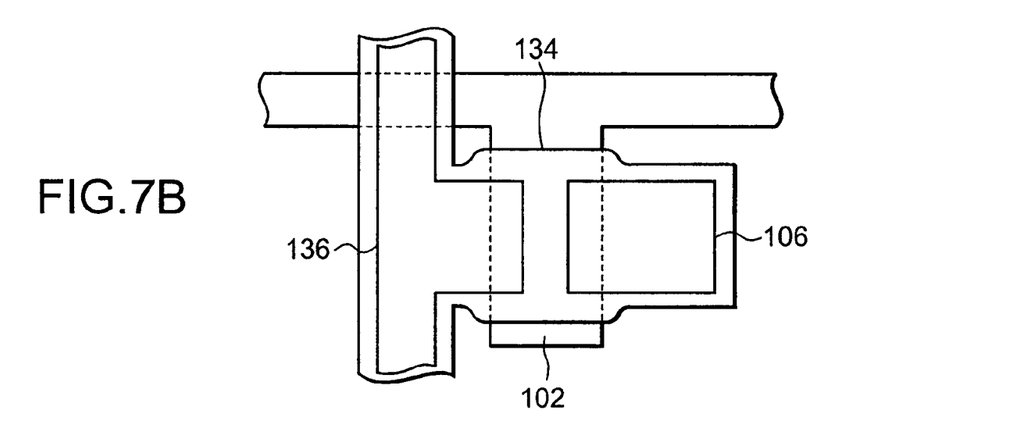
FIGS. 7B, 7C are plan views to be referred when referring to FIG. 7A.

The silicon layer 104 is then etched and removed by using the reflow mask pattern 423 as a mask, and the reflow mask pattern 423 is removed, whereby such a state shown in FIG. 7B is obtained that the ohmic contact layers 105 and 135, the source electrode 106 and the drain electrode 136 are formed on a semiconductor island 134. In FIG. 7B, the ohmic contact layers 105, 135 are disposed under the source/drain electrodes 106, 136 and thus cannot be viewed.

Figure 7C:
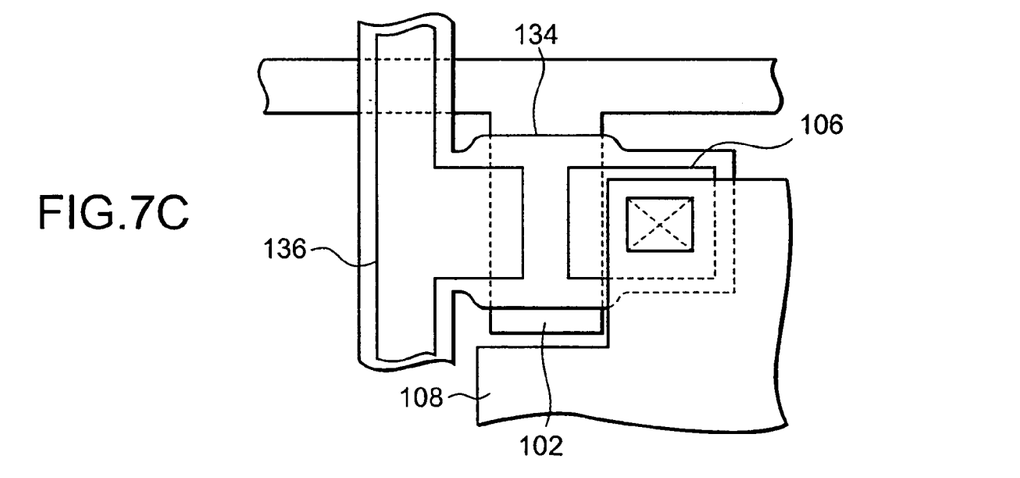

Thereafter, a passivation film is formed and contact holes are then formed therein on the source/drain electrodes 106, 136, and a pixel electrode 108 connected to the source electrode 106 and a terminal electrode (not shown) connected to the drain electrode 136 respectively at the bottoms of the contact holes are formed as shown in FIG. 7C.

According to the foregoing process steps of this embodiment, the part of the semiconductor island 134 around the channel region thereof formed later between the ohmic contact layers 105 and 135 is formed to have a width wider than that of the other part of the semiconductor island 134.

Embodiment 3

Figure 8A:
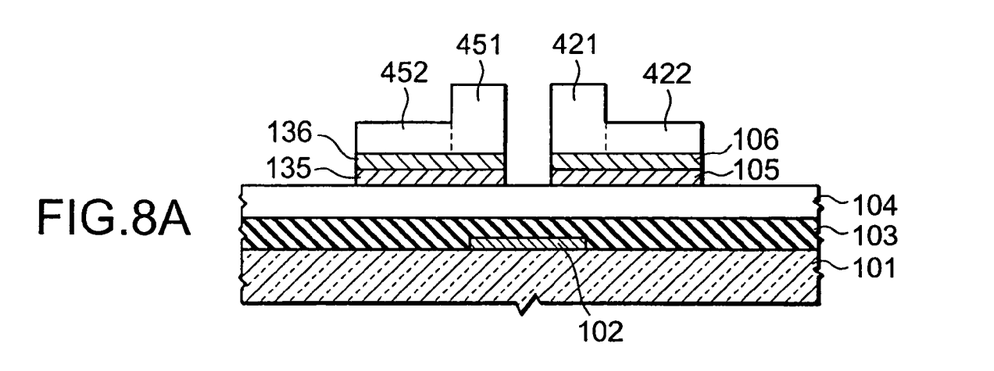
FIGS. 8A and 8B are cross sectional views showing the process steps for forming a pattern in accordance with the another embodiment of the invention.

A still another embodiment of the invention will be described. Also in this embodiment, as shown in FIG. 8A, process steps completely being the same as that of the embodiment 2 are performed. That is, thick mask patterns 421, 451 and thin mask patterns 422, 452 connected respectively thereto, all of which are made of a positive photoresist, are formed. Furthermore, ohmic contact layers 105, 135, source/drain electrodes 106, 136 are then formed on a silicon film 104 through dry etching using the mask patterns as a mask.

In this embodiment, after forming the ohmic contact layers 105, 135, and the source/drain electrodes 106, 136, the mask patterns are subjected to a plasma treatment by exposing the mask patterns to a plasma atmosphere, thereby removing the thin mask patterns 422, 452.

In this case, as a plasma employed in treatment of the mask patterns, a plasma consisting of only oxygen or a mixed gas containing oxygen. Concrete examples of the mixed gas that can be used for the plasma treatment include a mixture of an $O_2$ gas and an inert gas (such as $O_2$/He or $O_2$/Ar) and a mixture of an $O_2$ gas and a fluorine series gas ($O_2$/$SF_6$, $O_2$/$CF_4$ or $O_2$/$CHF_3$). Concretely, $O_2$ plasma treatment is carried out by applying $O_2$ gas at flow rate of 300 sccm, a pressure of 10 Pa and an RF power of 1,000 W for 100 seconds to the mask patterns. Note that instead of $O_2$ gas, one of $SF_6$/$O_2$, $CF_4$/$O_2$ and $CHF_3$/$O_2$ at a flow rate of 10/300 sccm may also be employed. In this case, it is important that taking into account of etching rate of the mask pattern, the time of plasma treatment is determined not to be longer than needed for the plasma gas to be able to remove the thin mask patterns in a necessary and sufficient manner.

Figure 8B:
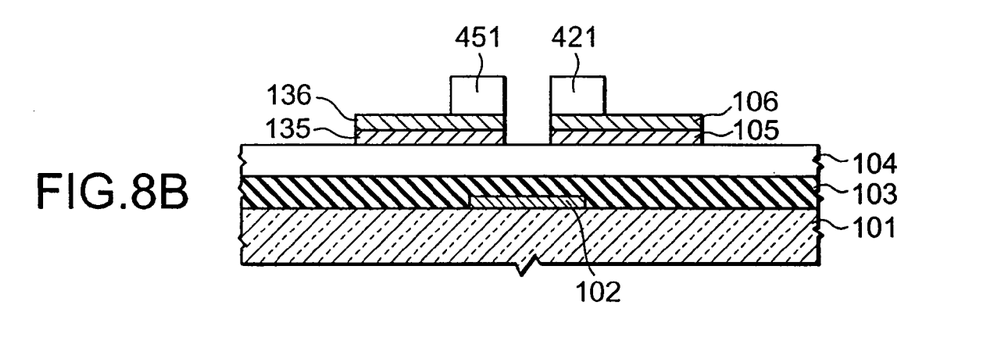
Figure 8C:
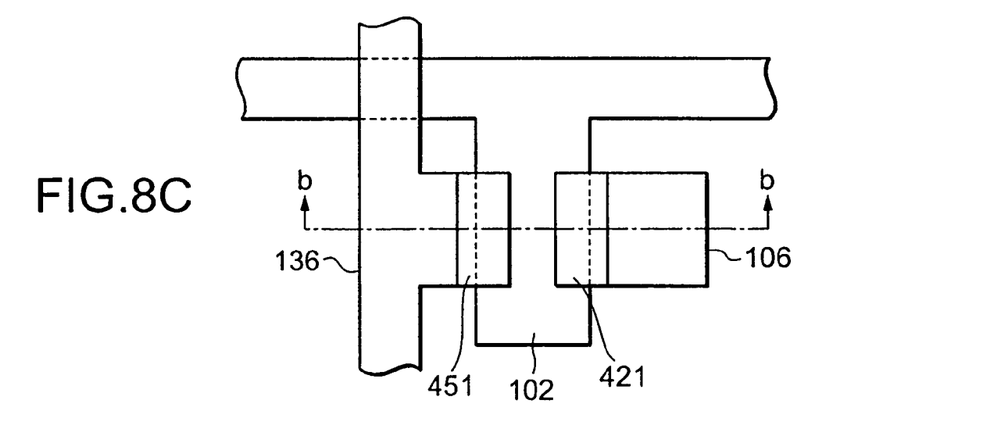
FIG. 8C is a plan view to be referred when referring to FIGS. 8A, 8B.

It should be noted that the plasma treatment of the mask patterns has to be carried out so as to leave the thick mask patterns 421, 451 as shown in FIGS. 8B and 8C. FIG. 8B is a cross sectional view taken along the line b—b in the plan view of FIG. 8C.

In the state of the thick mask patterns 421, 451 being left, a reflow step similar to that of the foregoing embodiment is carried out by heating the thick mask patterns. As a result of the reflow step, the mask patterns made of an organic resin expand over the surface of the silicon film 104, and the thick mask patterns 421, 451 are connected together on the silicon film 104 between the ohmic contact layers 105, 135.

Figure 9A:
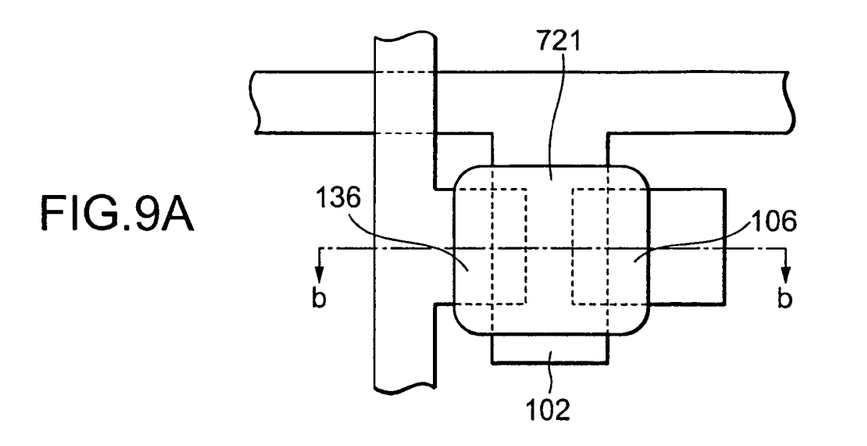
FIGS. 9A and 9C are plane views showing the process steps following the process step of FIG. 8C in accordance with another embodiment of the invention.
Figure 9B:
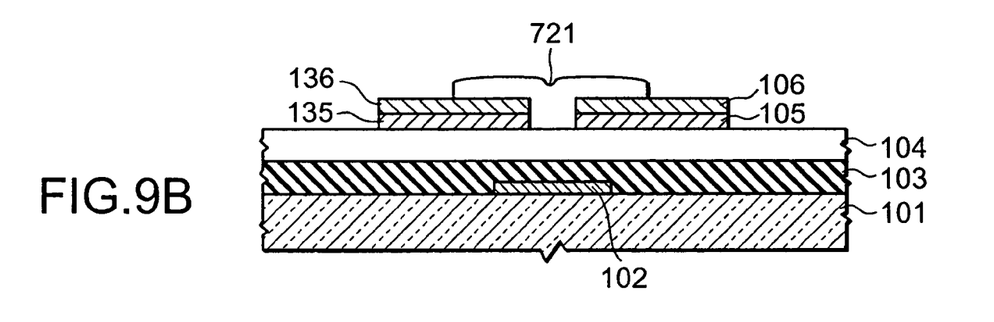
FIG. 9B is a plan view to be referred when referring FIG. 9A.

Consequently, as shown in the plan view of FIG. 9A and the cross sectional view of FIG. 9B, a reflow mask pattern 721 is formed on a region around a part between the ohmic contact layers 105, 135 where a channel is to be formed. The reflow mask pattern 721 is formed to have a width on left and right sides of the paper of FIG. 9A wider than that of the source electrode 106 and the drain electrode 136 in a channel width direction.

Figure 9C:
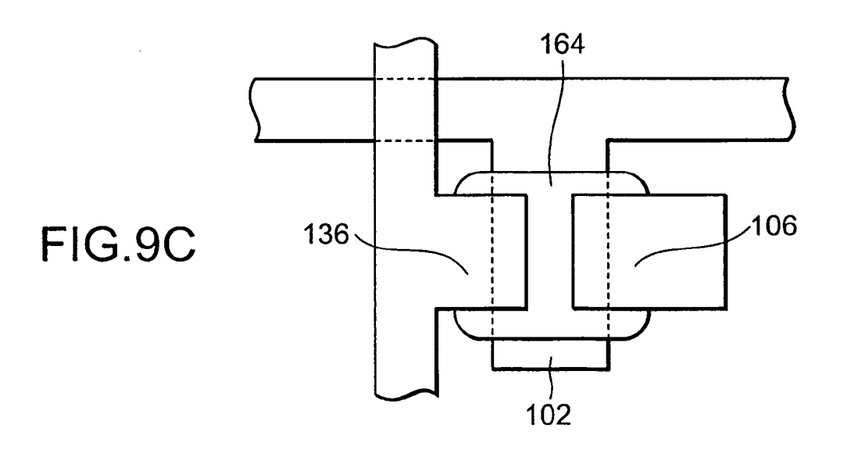

Thereafter, the silicon layer 104 is subjected to dry etching by using the reflow mask pattern 721 and associated parts of the source electrode 106 and the drain electrode 136, the associated parts being not covered by the reflow mask pattern 721, as a mask, to form a semiconductor island 164 as shown in FIG. 9C. Note that the semiconductor island 164 is formed to absolutely exist under the source electrode 106 and the drain electrode 136.

According to the embodiment described above, the reflow resist mask pattern 721 for forming the semiconductor island 164 is formed to have a substantially rectangular planer shape overlapping with the source/drain electrodes 106, 136 to some extent while centering on the later-formed channel region between the source/drain electrodes 106, 136. As a result, the semiconductor island 164 is formed self-aligned to the source/drain electrodes 106, 136 on a region other than reflow resist mask pattern 721 so as not to have expanded area larger than needed.

Thereafter, following to steps similar to that of the foregoing embodiment, a passivation film having contact holes therein on the source/drain electrodes 106, 136 is formed, and a pixel electrode 108 and a terminal electrode 109 connected to the source/drain electrodes 106, 136, respectively, at the associated bottoms of the contact holes.

It should be noted that though the foregoing embodiments employ a glass substrate as an insulating substrate, the insulating substrate employed therein is not limited to the glass substrate and therefore, other insulating substrate can be employed to obtain advantages similar to the foregoing embodiments.

Furthermore, though the process steps to completion of a staggered TFT are described in the foregoing embodiments, application of the process for forming a pattern in accordance with the invention is not limited to the above described staggered TFT, and the process for forming a pattern in accordance with the invention also be applied to the process for forming an active matrix substrate including a TFT with a color filter, the active matrix substrate further being constructed so that a pixel electrode has a color filter or a color filter/a planarizing layer therebelow. Furthermore, though a vertical electric field driven liquid crystal display apparatus is exemplified as a liquid crystal display apparatus in the foregoing embodiments, the process for forming a pattern in accordance with the invention can also be applied to a horizontal electric field driven liquid crystal display apparatus such as an IPS.

The process for forming a pattern shown in the foregoing embodiments can be applied to the production of, for example, an electroluminescence (EL) display apparatus, a filed emission display (FED), a fluorescent display apparatus, an active element of a plasma display panel (PDP) and a substrate having integrated circuits other than a liquid crystal display (LCD) apparatus for a flat panel display.

As described above, according to the invention, a mask pattern formed through only one photolithography process step is used in two etching process steps such that the mask pattern is used in the first etching step and the deformed mask pattern obtained by deforming the mask pattern is used in the second etching step, and therefore, such excellent advantages can be obtained that the number of process steps is reduced to lower the production cost. Furthermore, as will be understood by the skilled in the art, a mask pattern formed through only one photolithography process step can be used in more than two etching process steps by deforming the mask patterns at least two times.

What is claimed is:

1. A method for producing a liquid crystal display apparatus, comprising the steps of:
    forming a TFT substrate by a manufacturing method comprising:
    a step of forming a gate line and gate electrode on a first substrate and forming a gate insulating film on said first substrate covering said gate line and said gate electrode;
    a step of forming a semiconductor film, a semiconductor and ohmic contact film, and a metal film for source/drain electrodes in this order on said gate insulating film;
    a step of forming a resist mask for a source electrode and a resist mask for a drain electrode on said metal film for source/drain electrodes above said gate electrode;
    a step of etching said metal film for source/drain electrodes and said semiconductor and ohmic contact film by using said resist mask for a source electrode and said resist mask for a drain electrode as masks to form a laminated film pattern consisting of said semiconductor and ohmic contact film and said metal film for source/drain electrodes;
    a step of reflowing said resist mask for a source electrode and said resist mask for a drain electrode in a lateral direction to connect said resist mask for a source electrode and said resist mask for a drain electrode together to thereby form a connected resist mask, said connected resist mask completely covering said laminated film pattern; and
    a step of etching said semiconductor film by using said connected resist mask as a mask to form a semiconductor island;
    disposing a second substrate on a side of said semiconductor island of said first substrate to face said first substrate, thereby forming an opposing substrate; and
    filling a liquid crystal composition into a gap between said TFT substrate and said opposing substrate,
    said step of forming said connected resist mask being carried out by heating said resist mask for a source electrode and said resist mask.

2. The method for producing a liquid crystal display apparatus according to claim 1, wherein after said step of forming said semiconductor island, said process for producing a liquid crystal display apparatus further includes:
    a step of forming a protective insulating film on said gate insulating film to cover said laminated film pattern and said semiconductor island;
    a step of forming contact holes for source/drain electrodes by opening said protective insulating film on said source electrode and said drain electrode, and forming contact holes for said gate line by opening said protective insulating film in addition to said gate insulating film on said gate line; and
    a step of forming gate terminal electrodes on said protective insulating film to connect said gate line thereto and forming upper electrodes for source/drain electrodes to connect said laminated film pattern thereto on said protective insulating film through said associated contact holes.

3. The method for producing a liquid crystal display apparatus according to claim 1, wherein said step of forming said resist mask for a source electrode and said resist mask for a drain electrode on said metal film for source/drain electrodes is carried out by forming a thick resist mask having a certain film thickness on said metal film for source/drain electrodes on one sides of said resist mask for a source electrode and said resist mask for a drain electrode, said one sides facing each other, and forming a thin resist mask having a thickness thinner than said certain film thickness on said metal film for source/drain electrodes on the other sides thereof.

4. The method for producing a liquid crystal display apparatus according to claim 3, wherein said step of forming said connected resist masks is carried out by heating said thick resist mask and said thin resist mask followed by reflow thereof, and said connected resist mask has a plane shape expanded to a certain distance in a lateral direction in a vicinity of a channel region between said resist mask for a source electrode and said resist mask for a drain electrode, and expanded to a distance gradually shorter than said certain distance in accordance with a degree of a part of said connected resist mask being away from said channel region in a lateral direction.

5. The method for producing a liquid crystal display apparatus according to claim 4, wherein said process for producing a liquid crystal display apparatus further includes a step of etching said resist mask for a source electrode and said resist mask for a drain electrode to remove only said thin resist mask while at least leaving said thick resist mask as a remaining resist mask between said step of forming said laminated film pattern and said step of forming said connected resist mask.

6. The method for producing a liquid crystal display apparatus according to claim 5, wherein said connected resist mask is formed to cover at least said channel region.

* * * * *